United States Patent [19]
Owen et al.

[11] Patent Number: 5,466,332
[45] Date of Patent: Nov. 14, 1995

[54] DUAL ETCHING OF CERAMIC MATERIALS

[75] Inventors: Robert A. Owen, Rowlett; James F. Belcher, Plano, both of Tex.

[73] Assignee: Texas Instruments Incorporated, Dallas, Tex.

[21] Appl. No.: 223,087

[22] Filed: Apr. 4, 1994

[51] Int. Cl.$^6$ .............................. B44C 1/22; C03C 15/00
[52] U.S. Cl. ................... 156/630; 156/633; 156/645; 156/648; 156/651; 156/663; 156/667; 156/643
[58] Field of Search .................... 156/630, 633, 156/643, 644, 645, 648, 651, 654, 659.1, 663, 667, 661.1; 437/3, 226, 086, 974

[56] References Cited

U.S. PATENT DOCUMENTS

| | | | |
|---|---|---|---|
| 4,080,532 | 3/1978 | Hopper | 250/332 |
| 4,593,456 | 6/1986 | Cheung | 437/3 |
| 4,745,278 | 5/1988 | Hanson | 250/338.2 |
| 4,792,681 | 12/1988 | Hanson | 250/338.2 |
| 4,927,771 | 5/1990 | Ferrett | 437/3 |

OTHER PUBLICATIONS

D. J. Warner, D. J. Pedder, J. S. Moody and J. Burrage, "The Preparation and Performance of Reticulated Targets for the Pyroelectric Vidicon", *Ferroelectrics*, 33, 1981, pp. 249–253.

R. Watton, F. Ainger, S. Porter, D. Pedder and J. Gooding, "Technologies and Performance for Linear and Two Dimensional Pyroelectric Arrays", SPIE vol. 510, Infrared Technology X, 1984, pp. 139–149.

T. D. Flaim, G. A. Barner, and T. Brewer, "A Novel Release Layer syster for IC Processing", Brewer Science, Inc. Rolla, Missouri, presented at KTI IF Conference, Nov. 1989.

C. Hanson, H. Beratan, R. Owen, and K. Sweetser, "Low–Cost Uncooled Focal Plane Array Technology", Texas Instruments Incorporated, DSEG, presented at IRIS Specialty Group on Infrared Detectors, Bedford, Mass., Jul. 14, 1993.

C. Hanson, "Uncooled Thermal Imaging at Texas Instruments", SPIE 1993, International Symposium on Optics, Imaging and Instrumentation, Infrared Technology XIX, San Diego, Jul. 14, 1993.

H. Kaufman, R. Robinson, W. Hughes, "Characteristics, Capabilities, and Applications of Broad–Beam Sources", Commonwealth Scientific Corporation, Alexandria, Va., 1987.

R. Watton, "Ferroelectrics for Infrared Detection and Imaging", *ISAF '86, Proceedings of the Sixth IEEE International Symposium on Applications of Ferroelectrics*, Jun. 1986.

*Primary Examiner*—William Powell
*Attorney, Agent, or Firm*—Brian A. Carlson; James C. Kesterson; Richard L. Donaldson

[57] ABSTRACT

A novel method etching through a substrate (e.g. BST 22) comprises removing thick substrate material from the backside of the substrate to form vias (e.g. cavity 24) all the way to the back surface of a frontside thin film (e.g. optical coating 20). To prevent damage to the frontside thin film while etching from the backside of the supporting substrate, the periphery of each frontside pixel is surrounded by a trench (e.g. etch stop trench 30) much deeper than the thickness of the thin film but also significantly shallower than the thickness of the substrate. This trench is then filled with an etch stop material (e.g. photoresist 32). This etch stop may be partially removed by the backside etching method but provides a tolerant means of recognizing when to stop etching before frontside film damage occurs. After etching the substrate down to and partially through the etch stop, the assembly is removed from the substrate etching medium. The remaining etch stop material may be removed with a specific agent which does not damage the frontside film. For example, if the etch stop is an organic material, such as photoresist, it may be removed from the back with a suitable solvent or dry etch without damaging either the substrate or the frontside thin film.

19 Claims, 3 Drawing Sheets

DUAL ETCHING OF CERAMIC MATERIALS

CROSS-REFERENCES TO RELATED APPLICATIONS

The following related applications were filed concurrently with the instant application on Apr. 4, 1994:

| Title | Inventors | Serial Number/ Filing Status |
|---|---|---|
| Etching of Ceramic Materials with an Elevated Thin Film | Belcher, Owen | 08/223,073, pending |
| Dual Etching of Ceramic Materials with an Elevated Thin Film | Belcher, Owen | 08/223,088, pending |
| Dual Etching of Ceramic Materials with a Thin Front Film | Belcher, Owen | 08/222,769, pending |
| An Elevated Thin Film for Ceramic Materials | Belcher | 08/222,144, pending |
| Multiple Level Mask for Patterning of Ceramic Materials | Belcher, Frank, Jones, Long | 08/222,146, pending |

FIELD OF INVENTION

This invention generally relates to a method of forming semiconductor geometries whereby cavities are etched into a substrate material while leaving substantially unharmed, in a controllable manner, a thin layer of material on one side of the substrate.

BACKGROUND OF INVENTION

In certain semiconductor and optical devices it is desired to maintain an undamaged thin film surface, which will be referred to as the frontside, while etching vias completely through the supporting substrate from the opposite side, hereafter referred to as the backside. If the front thin film surface does not have a strong resistance to the etch method being used to remove the backside substrate, the frontside thin layer will be damaged or destroyed.

One device which requires such an etching process is an infrared (IR) imaging array which is described in detail in (1) U.S. Pat. No. 4,080,532, Hopper, 3/1978; (2) U.S. Pat. No. 4,745,278, Hanson, 5/1988; (3) U.S. Pat. No. 4,792,681, Hanson, 12/1988; and (4) "LOW-COST UNCOOLED FOCAL PLANE ARRAY TECHNOLOGY", by Hanson, Beratan, Owen and Sweetser, presented Aug. 17, 1993 at the IRIS Detector Specialty Review.

Although the novel process to be described is not restricted to this type of IR imager, a brief description of the physical requirements clarifies the need for such processes.

An area imager may contain several hundred to tens of thousand individual picture elements (pixels). Each of these pixels consists of a capacitor (or resistor or another type of electronic element) that has a heat (IR intensity) sensitivity. Making use of the fact that the charge stored by a capacitor is proportional to the product of its terminal voltage and its capacitance, electronic circuitry can be attached to the two terminals of the capacitor based pixel to measure the intensity of the IR impinging on a specific pixel. Obstructions in the imaging field are removed and the electronic connections to these capacitors are simplified if one of the capacitor terminals is made common to all. Hundreds to tens of thousands of connections must still be made between the other isolated terminals of the capacitors and the electronic sensing circuitry. In addition, the pixel capacitors should be thermally isolated from each other while having one terminal connected to all the other common terminals.

The common connection to one side of the pixel capacitors consists of a frontside thin film. This may be a composite of a plurality of thin films which have been optimized with regard to IR absorbency, IR transparency, electrical conductivity, thermal resistivity, etc.. The thicker heat sensitive dielectric substrate in this case can be barium-strontium-titanate (BST) which is a ceramic perovskite material.

To leave the frontside thin film electrically conducting while isolating the pixels thermally, one may etch vias from the backside of the BST and stop the etch at the back surface of the frontside thin film. There has not yet been found a reactive type etch with sufficient selectivity that will etch the perovskite material and not harm the frontside thin film. Two of the few ways to remove BST is by the highly nonspecific methods of ion milling or laser ablation. Although at somewhat varying rates, most materials are etched by both of these methods. Neither the spatial uniformity nor the etch rate of ion milling or laser ablation can be controlled accurately enough to stop the backside etching of the substrate before damage occurs to the frontside film.

This invention describes methods to remove thick substrate material from the backside to form vias all the way to the back surface of the frontside material without frontside damage.

SUMMARY OF THE INVENTION

To prevent the damage to the frontside thin film while etching from the backside of the supporting substrate, the periphery of each frontside pixel is surrounded by a trench much deeper than the thickness of the thin film but also significantly shallower than the thickness of the substrate. This trench is then filled with an etch stop material. This etch stop may be partially removed by the backside etching method but provides a tolerant means of recognizing when to stop etching before frontside film damage occurs. After etching the substrate down to and partially through the etch stop, the assembly is removed from the substrate etching medium. The remaining etch stop material may be removed with a specific agent which does not damage the frontside film. For example, if the etch stop is an organic material, such as photoresist, it may be removed from the back with a suitable solvent without damaging either the substrate or the frontside thin film.

One embodiment of the present invention is a microelectronic structure comprising a substantially undamaged continuous optical coating layer, a reticulated array of ceramic islands disposed on the optical coating layer, and thin electrical contacts disposed on a surface of the ceramic islands opposite the optical coating layer. In another embodiment, the ceramic islands comprise a middle cross-sectional area between the optical coating layer and the electrical contacts that is greater than a first cross-sectional area proximate the optical coating layer, and is greater than a second cross-sectional area proximate the electrical contacts. The infrared sensitive ceramic islands can have reduced thermal mass and increased thermal responsivity due to the smaller first and second cross-sectional areas.

A method of forming an embodiment of the present invention comprises providing a ceramic substrate having a front side and a back side, and etching a first predetermined pattern partially into the front side of the substrate, thereby forming etch stop trenches having the first predetermined pattern. The method further comprises filling the etch stop trenches with an etch stop material, depositing a thin front layer on the front side of the substrate, and etching a second predetermined pattern into the back side of the substrate. The second predetermined pattern is substantially the same as the first predetermined pattern, and is substantially aligned with the etch stop trenches on the front side, thereby forming cavities extending down to and partially into the etch stop material, but not extending to the thin front layer. The method further comprises removing the etch stop material, thereby forming isolated islands of the ceramic substrate connected by the thin front layer. The thin front layer remains substantially undamaged, having not been exposed to the etching processes forming the first and second predetermined patterns.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Some of the preferred embodiments will be described with reference to FIGS. 1–12 and the Table. For illustrative purposes, a specific IR imaging detector array described in the "Background" is used. This novel etch method is not restricted to that device alone. Some of the alternate fabrication methods and materials of construction will be described. In addition, only a few detectors are illustrated in the figures, but the present invention can be applied to any number of detectors in various configurations (e.g. single line or array).

Figure 1:
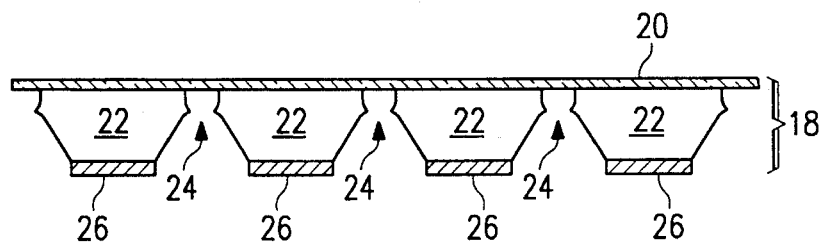
FIG. 1 shows a cross section of the device structure after achieving the desired results of this invention.
Figure 2:
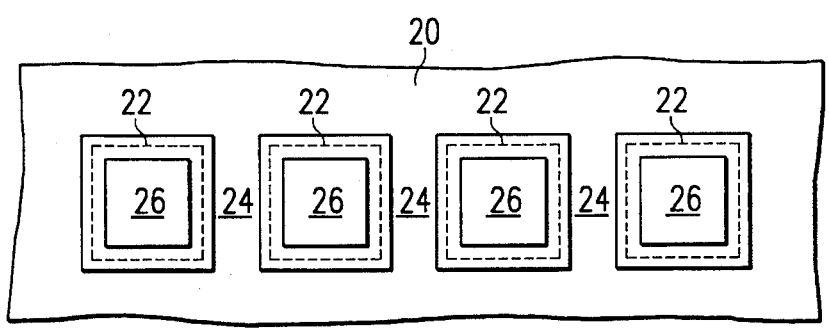
FIG. 2 shows the bottom view of FIG. 1.

FIG. 1 and FIG. 2 show a cross section and backside view respectively of the topology to be achieved by the invented method. The pixel capacitors 18 consist of the dielectric 22 between metals 20 and 26. A thin planar film optical coating 20, which is electrically conductive and IR absorbent, covers the frontside area and forms one side of the pixel capacitors. The dielectric of each capacitor consists of BST 22 which is thermally isolated from its neighbors by the etched cavity 24. The other side of the pixel capacitors consists of a planar array of many metallic thin film bonding surfaces 26 all of which are both thermally and electrically isolated from each other.

Figure 3:
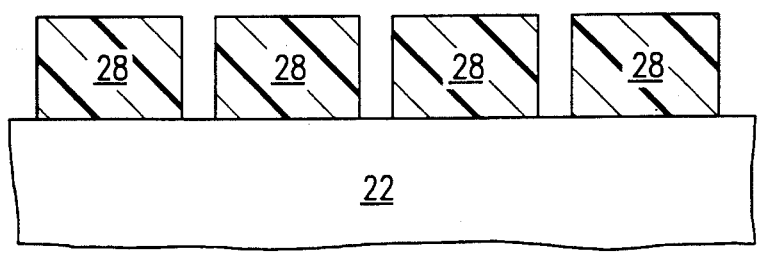
FIG. 3 is a cross section of the substrate with patterned photoresist applied.
Figure 4:
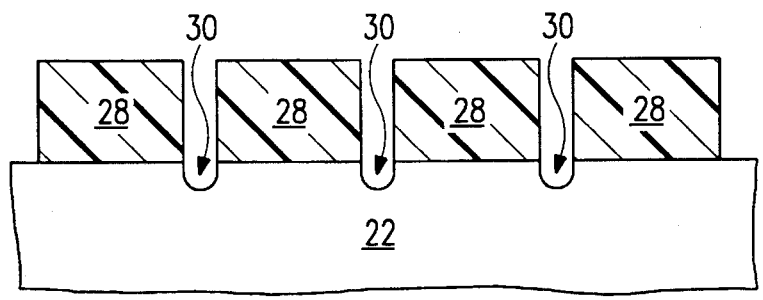
FIG. 4 is a view of the substrate after trenches have been defined.
Figure 5:
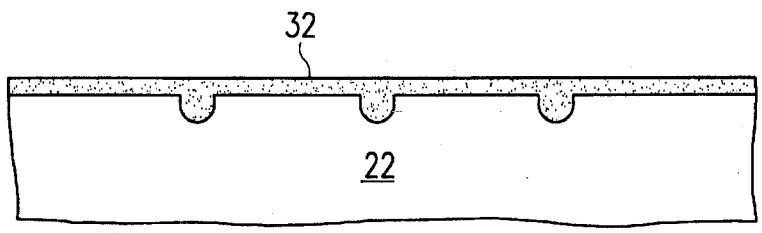
FIG. 5 shows the substrate with the trenches filled with an etch stop material.
Figure 6:
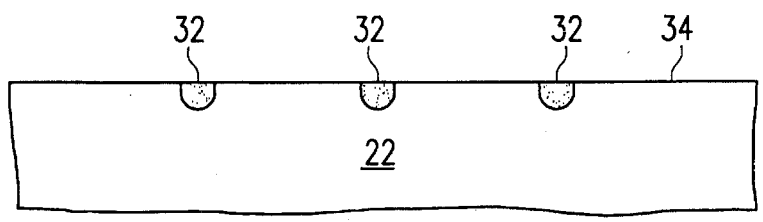
FIG. 6 shows the substrate after the surface has been planarized by a mechanical polishing method.
Figure 7:
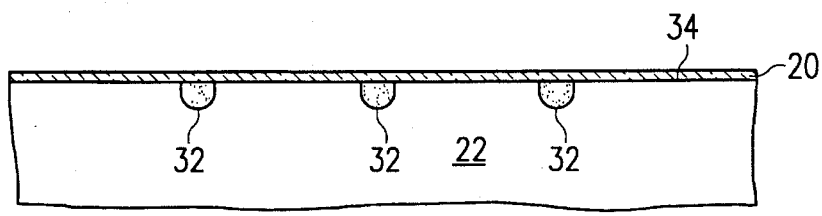
FIG. 7 shows the addition of an optical coating which is an IR transparent but electrically conducting thin film.

The location of the frontside etch stop is defined by conventional photolithography techniques as shown in FIG. 3. Photoresist etch mask 28 is applied, exposed and developed on the BST substrate 22. The etch stop trench 30 is ion milled to a depth of 5–6 micrometers as shown in FIG. 4. The photoresist 28 is then stripped and the trenches 30 filled with etch stop material 32 such as polymide release layer, "PIRL", a trademark of Brewer Science, Inc., as shown in FIG. 5. The frontside surface of the assembly is then mechanically polished such that 32 and 22 are coplanar and form smooth surface 34 as shown in FIG. 6. The thin film optical coating 20 is now deposited on smooth surface 34 as shown in FIG. 7.

Figure 8:
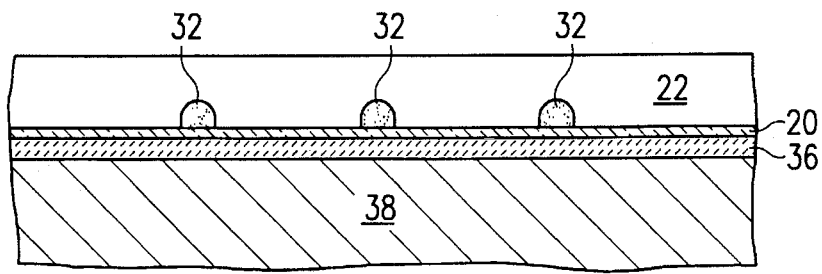
FIG. 8 shows the substrate mounted upside down on a carrier after the substrate has been mechanically ground and polished to reduce the substrate thickness.
Figure 9:
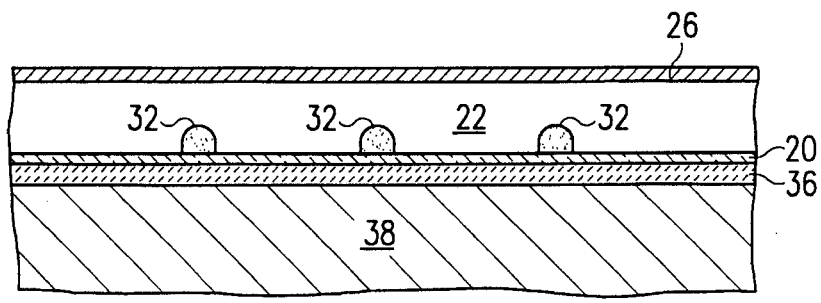
FIG. 9 has added a metal film to the backside of the substrate which will later be used to bond connections to sensing circuitry.
Figure 10:
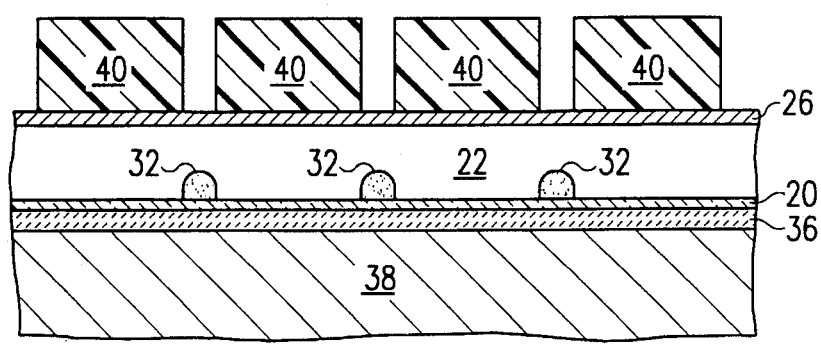
FIG. 10 shows a view after the backside photoresist has been patterned while aligned with the frontside etch stop.
Figure 11:
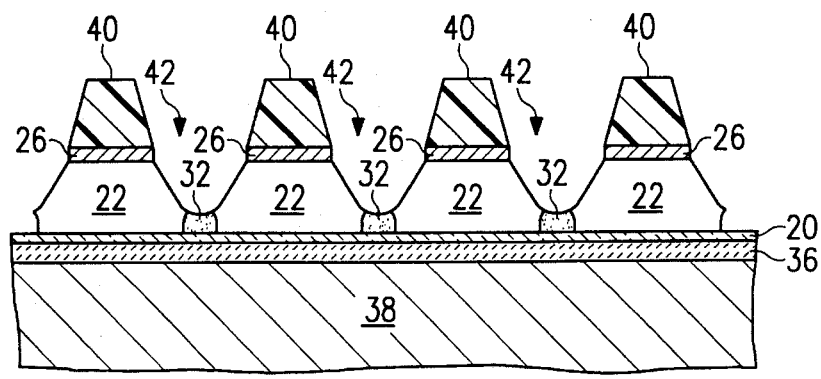
FIG. 11 indicates what is left after ion milling from the backside down to the etch stop beneath the frontside film.

To prepare for backside etching, the frontside is mounted to a mechanical carrier 38 with an adhesive 36. The BST substrate 22 is mechanically polished and thinned from the backside to a thickness of 18 micrometers (generally to between 1 and 200 micrometers) as shown in FIG. 8. The thin film backside electrical contact metal 26 is now deposited as shown in FIG. 9. The via cavity 42 to be etched from the backside is defined with photoresist 40 which is aligned with the frontside etch stop 32 as shown in FIG. 10. The complete assembly is placed in an ion mill and the etching produces the cavity 42 as shown in FIG. 11.

Figure 12:
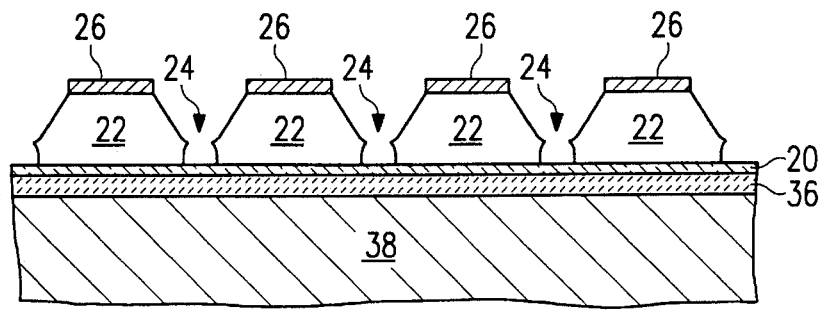
FIG. 12 illustrates the final desired geometry as shown in FIG. 1 and 2 (but upside down) after the photoresist and the etch stop material have been cleaned away.

The resist 40 and the etch stop material 32 are removed with a solvent or with a dry etch as shown in FIG. 12. Although still mounted on the mechanical carrier 38 and upside down, it can be seen that this is the desired topology sought that was shown in FIG. 1 and FIG. 2. An additional advantage of dual side etching is that dielectric 22 has lower thermal mass due to extra material being removed during the frontside etch which may provide improved thermal responsivity.

Alternatively, a tri-level resist may be used for either the top side etch mask 28 or the back side etch mask 40. A tri-level resist consists of a 1–2 μm top layer of photoresist over a 500–1500Å TiW (or oxide) layer over a 8–20 μm bottom layer of photoresist. The top layer of photoresist is patterned by standard photolithographic means and used as an etch mask for the underlying TiW. After the TiW is patterned by plasma means using the gas $CF_4$, or equivalent, the TiW layer is used as a mask for the underlying bottom layer of photoresist. Vertical sidewalls of the bottom layer of photoresist are achieved with a low pressure (<10 mTorr) dry etch. This vertical sidewall tri-level resist can then be used as an etch mask for ion milling the etch stop trenches 30 or the etched cavities 42.

The sole Table, below, provides an overview of some embodiments and the drawings.

TABLE

| ID# | Description | Material | Alternates |
|-----|-------------|----------|------------|
| 18 | Pixel capacitors | | |
| 20 | Optical coating | NiCr 50 Å | 25–100 Å-other think film metal |
| | | Parylene 1.4 μm | ¼ desired IR wavelength-other organics (e.g. polyimide, photoresist, epoxy) |
| | | NiCr 1000 Å | 500–2000 Å-other thin film metals |
| 22 | Substrate | BST 0.06 cm (unthinned) 18 μm (thinned) | 0.01–0.25 cm (unthinned) 1–200 μm (thinned) Any pyroelectric material |
| 24 | Cavity for thermal isolation | Vacuum | Air, inert gas |
| 26 | Backside electrical contact | Bonding Alloys such as thin layers of: | |
| | | In 3 μm | 0.15–6 μm |
| | | Au 0.1 μm | 0.05–0.15 μm |
| | | NiCr 0.05 μm | 0.05–0.15 μm |
| | | TiW 0.05 μm | 0.02–0.10 μm |
| 28 | Front etch mask | Photoresist 14 μm | 4,000 to 200,000 Å |
| 30 | Etch stop trench | | 4–8 μm |
| 32 | Frontside etch stop | Filler of organic or inorganic material | 4–10 μm Photoresist, oxide, polyimide, parylene, epoxy, nitride, "PIRL" |
| 34 | Planar surface | | |
| 36 | Frontside adhesive | Wax 0–10 μm | Epoxy |
| 38 | Mechanical carrier | Glass | Silicon, quartz, ceramic |
| 40 | Backside etch mask | Photoresist (may be covered with selected metals) | 4000–200,000 Å |
| 42 | Etched cavity | as 24 above | |

While this invention has been described with reference to illustrative embodiments, this description is not intended to be construed in a limiting sense. The etch masks and etch stop material can be many various materials such as but not limited to photoresist, oxide (e.g. $SiO_2$), polyimide, parylene, polyamide, epoxy, nitride (e.g. $Si_3N_4$), "PIRL", and combinations thereof. There are certain silicon devices where mechanical flexure of thin films free from surrounding support must be electrically and physically attached at least at one point. These could use the invented method to advantage. In millimeter wavelength and very high speed computer integrated circuits, one wishes the highest possible isolation from crosstalk and the lowest possible stray capacitance. A cavity defined by this novel method and filled with dry air or vacuum or an inert gas offers a solution to such problems. There are also many variants and combinations of the materials and dimensions shown in these embodiments. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising steps:

(a) providing a ceramic substrate having a front side and a back side;

(b) etching a first pattern partially into said front side of said substrate, thereby forming etch stop trenches having said first pattern;

(c) filling said etch stop trenches with an etch stop material;

(d) depositing a thin front layer on said front side of said substrate;

(e) etching a second pattern into said back side of said substrate, said second pattern substantially the same as said first pattern, and substantially aligned with said etch stop trenches on said front side, thereby forming cavities extending down to and partially into said etch stop material, but not extending to said thin front layer; and (f) removing said etch stop material, thereby forming isolated islands of said ceramic substrate connected by said thin front layer, whereby the thin front layer remains substantially undamaged, having not been exposed to the etching processes of steps (b) and (e).

2. The method according to claim 1, wherein said ceramic substrate is barium strontium titanate.

3. The method according to claim 1, said step (b) further comprising:

forming a first mask layer on said front side of said substrate before said etching of said first pattern; and removing said first mask layer after said etching of said first pattern.

4. The method according to claim 3, wherein said first mask layer is photoresist.

5. The method according to claim 1, wherein said etch stop material is selected from the group consisting of: photoresist, silicon dioxide, polyimide, parylene, epoxy, silicon nitride, and spin on glass.

6. The method according to claim 1, said step (c) further comprising:

planarizing said etch stop material and said front side of said substrate after said filling of said etch stop trenches.

7. The method according to claim 1, wherein said thin front layer comprises multiple layers, and said step of depositing said thin front layer further comprises:

depositing a conductive metallic layer on said front side of said substrate;

depositing a transparent organic layer on said conductive metallic layer; and depositing a thin transparent metal layer on said transparent organic layer.

8. The method according to claim 7, wherein said conductive metallic layer is NiCr, said transparent organic layer is parylene, and said thin transparent metal layer is NiCr.

9. The method according to claim 1, wherein a top surface of said thin front layer opposite said ceramic substrate is mounted to a removable carrier after said step of depositing said thin front layer, wherein said carrier provides mechanical support for subsequent process steps.

10. The method according to claim 1, said method further comprising thinning said ceramic substrate by mechanically polishing said back side of said ceramic substrate before said step of etching said second pattern.

11. The method according to claim 10, said method further comprising depositing a thin electrical contact on said back side of said ceramic substrate after said step of thinning said ceramic substrate, and etching said thin electrical contact during said step of etching said second pattern.

12. The method according to claim 11, wherein said islands form infrared sensitive capacitors.

13. The method according to claim 11, wherein said thin electrical contact comprises two or more layers, and comprises indium.

14. The method according to claim 1, said step (e) further comprising:

forming a second mask layer on said back side of said substrate before said etching of said second pattern; and removing said second mask layer after said etching of said second pattern.

15. The method according to claim 14, wherein said second mask layer is photoresist.

16. The method according to claim 1, wherein said steps of etching said first and second patterns comprise ion milling.

17. The method according to claim 1, wherein said etch stop material is removed with a wet solvent or a dry etch.

18. The method according to claim 1, wherein said islands of said ceramic substrate form a reticulated array.

19. The method according to claim 18, wherein said microelectronic structure is an infrared radiation detector.

* * * * *